United States Patent
Peng et al.

(10) Patent No.: US 7,826,213 B2
(45) Date of Patent: Nov. 2, 2010

(54) SERVER CHASSIS WITH ACCESS FLAP

(75) Inventors: Wen-Tang Peng, Taipei Hsien (TW);
Jun-Xiong Zhang, Shenzhen (CN);
Zhi-Xin Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 193 days.

(21) Appl. No.: 12/192,080

(22) Filed: Aug. 14, 2008

(65) Prior Publication Data
US 2009/0168328 A1    Jul. 2, 2009

(30) Foreign Application Priority Data
Dec. 27, 2007    (CN) .......................... 200710203467

(51) Int. Cl.
*G06F 1/20*    (2006.01)
(52) U.S. Cl. ............................. 361/679.46; 361/679.02; 361/727; 312/223.1
(58) Field of Classification Search ............ 361/679.46, 361/679.02, 692, 727; 312/223.1–223.2
See application file for complete search history.

(56) References Cited

U.S. PATENT DOCUMENTS

| | | | |
|---|---|---|---|
| 6,683,785 B1 * | 1/2004 | Chen ...................... | 361/679.33 |
| 7,355,115 B2 * | 4/2008 | Liang .......................... | 174/50 |
| 7,663,881 B2 * | 2/2010 | Kuo ........................... | 361/692 |
| 2005/0265003 A1 * | 12/2005 | Coglitore et al. ............ | 361/724 |

\* cited by examiner

*Primary Examiner*—Jayprakash N Gandhi
*Assistant Examiner*—Ingrid Wright
(74) *Attorney, Agent, or Firm*—Zhigang Ma

(57) ABSTRACT

The invention relates to an access flap for shielding an opening defined in a server chassis. that the access flap includes a rotating plate, a sliding plate, and a resilient member. The rotating plate is pivotably mounted to a side of the opening of the server chassis. The rotating plate defines a plurality of first air holes therein. The sliding plate is slidably attached to the rotating plate. The sliding plate defines a plurality of second air holes therein. The resilient member includes two ends connected to the rotating plate and the sliding plate. The rotating plate can rotate and the sliding plate can slide when a functional module passes through the opening to enter into the server chassis. Thereby, he second air holes of the sliding plate are aligning with the first air holes of the rotating plate.

12 Claims, 11 Drawing Sheets

SERVER CHASSIS WITH ACCESS FLAP

BACKGROUND

1. Field of the Invention

The invention generally relates to server chassis, and particularly to a server chassis having an access flap.

2. Description of Related Art

Generally, an opening is defined in one end of a server chassis via which a functional module, such as a power supply, can be inserted into or drawn out of the server chassis. When the functional module is removed from the server chassis, the opening of the server chassis should be shielded, otherwise the air outside the server chassis will flow into the server chassis to interfere with the normal airflow in the server chassis and possibly impair an efficiency of heat dissipation in the server chassis. A shielding apparatus is typically attached to the chassis by a plurality of screws, which makes the installation and detachment of the shielding apparatus tedious and time-consuming.

What is needed, therefore, is to provide a server chassis having access which overcomes the above-mentioned problems.

DETAILED DESCRIPTION OF THE EMBODIMENT

Figure 1:
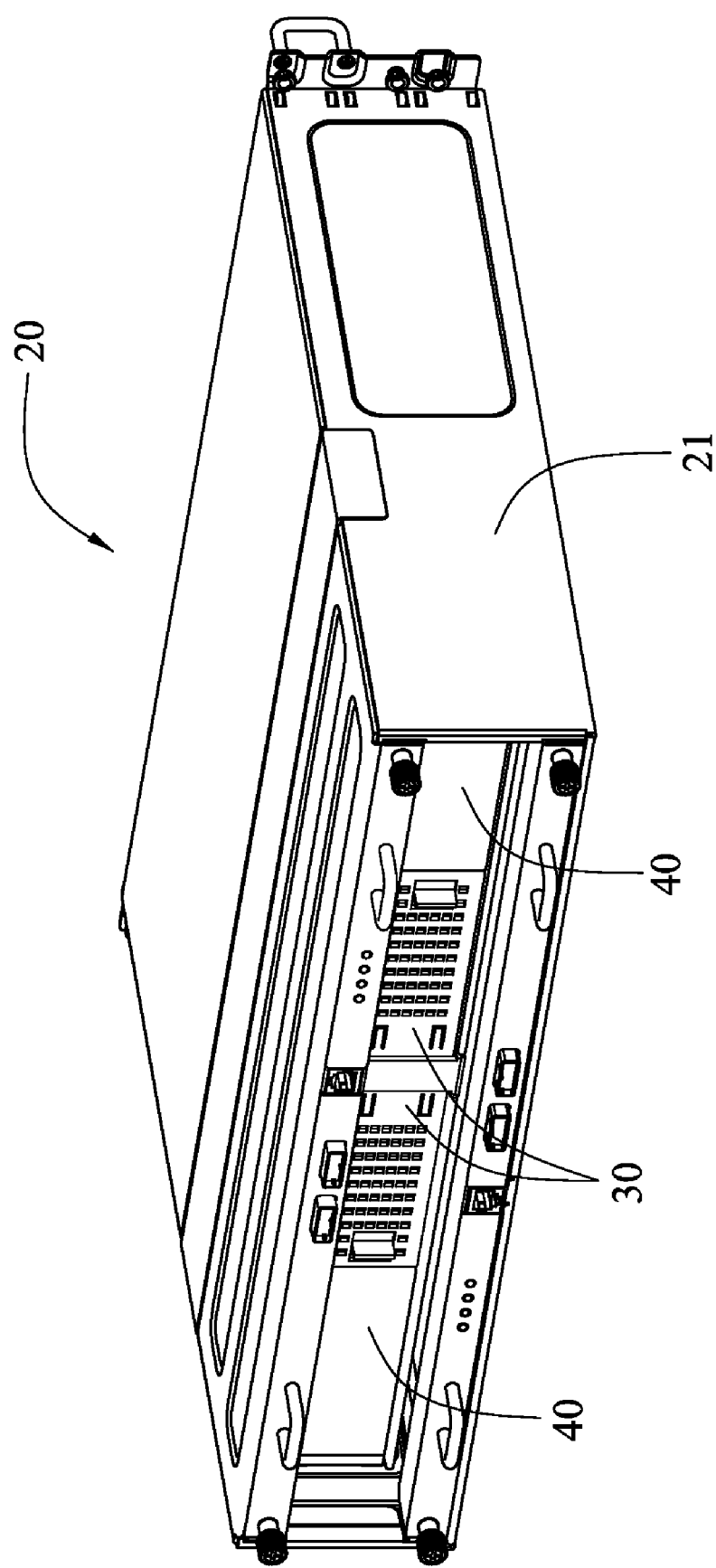
FIG. 1 is an assembled, isometric view of a server chassis in accordance with an embodiment of the present invention.

Referring to FIG. 1, a server chassis in accordance with an embodiment of the present invention includes a base 20, two first access flaps 30, and two second access flaps 40.

Figure 2:
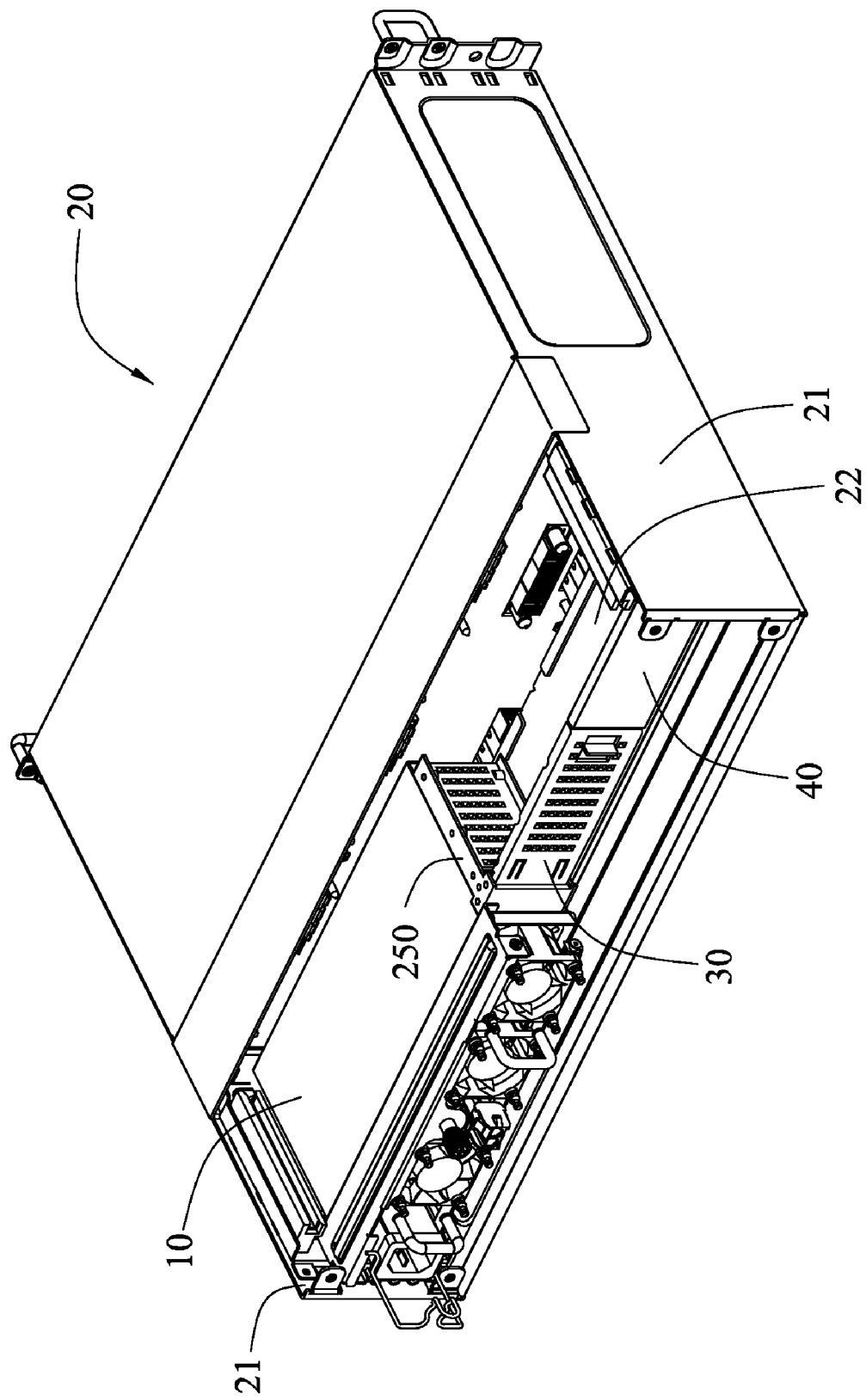
FIG. 2 is a partially cutaway view of FIG. 1, showing a functional module mounted to the server chassis, the server chassis including a mounting plate, a first access flap, and a second access flap.

Referring also to FIG. 2, the base 20 includes a bottom panel 22, two parallel side panels 21 vertically extending upward from opposite sides of the bottom panel 22 respectively, and a mounting plate 250 vertically mounted to the bottom panel 22. A space is defined between each side panel 21 and the mounting plate 250, for receiving a functional module 10, such as a power supply or a communicating module. An opening (not labeled) is defined in a rear side of the base 20 between each side panel 21 and the mounting plate 250, for the functional module 10 passing therethrough to enter into the space.

Figure 3:
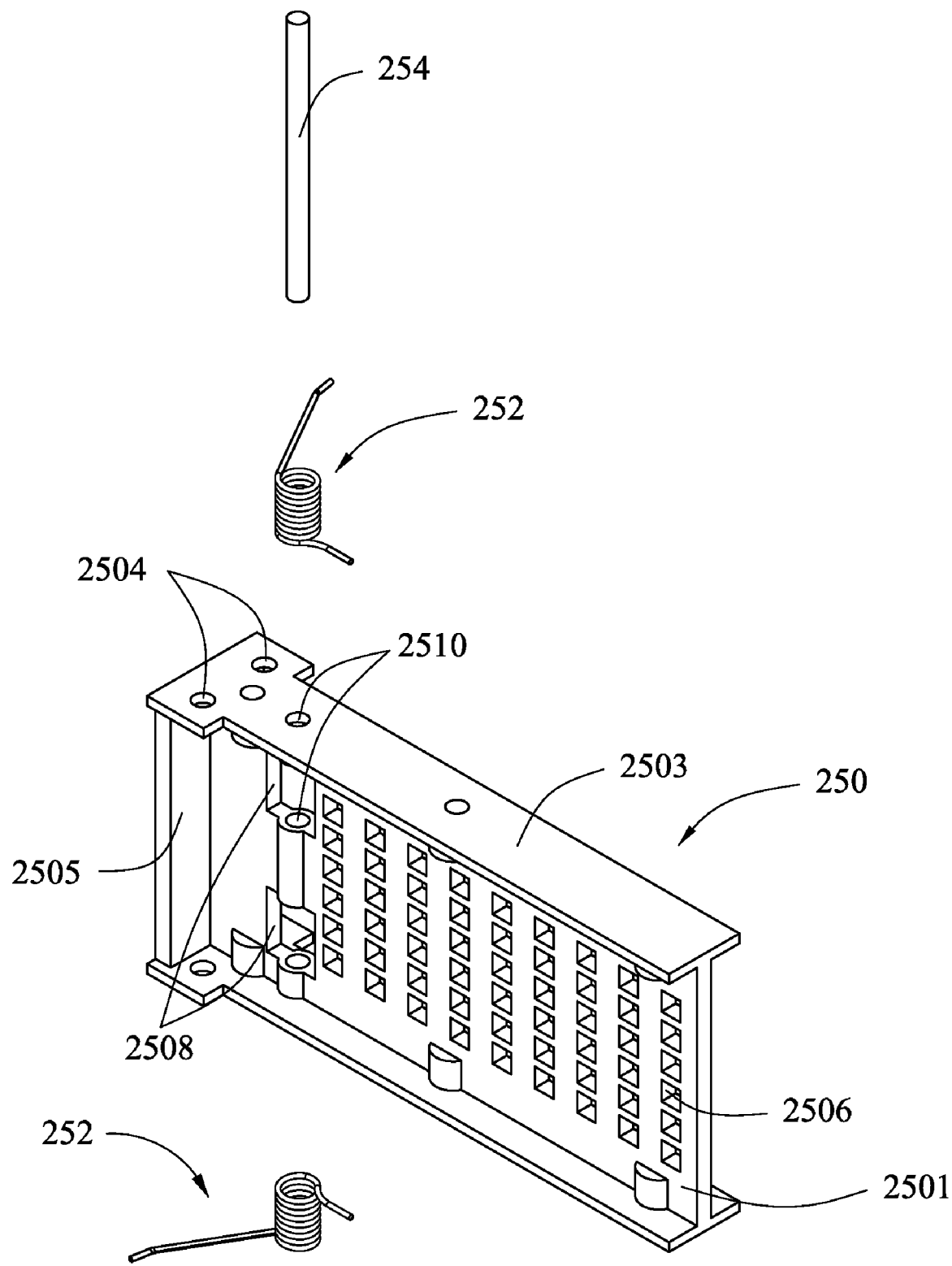
FIG. 3 is an exploded, isometric view of the mounting plate of FIG. 2, but viewed from another aspect.
Figure 4:
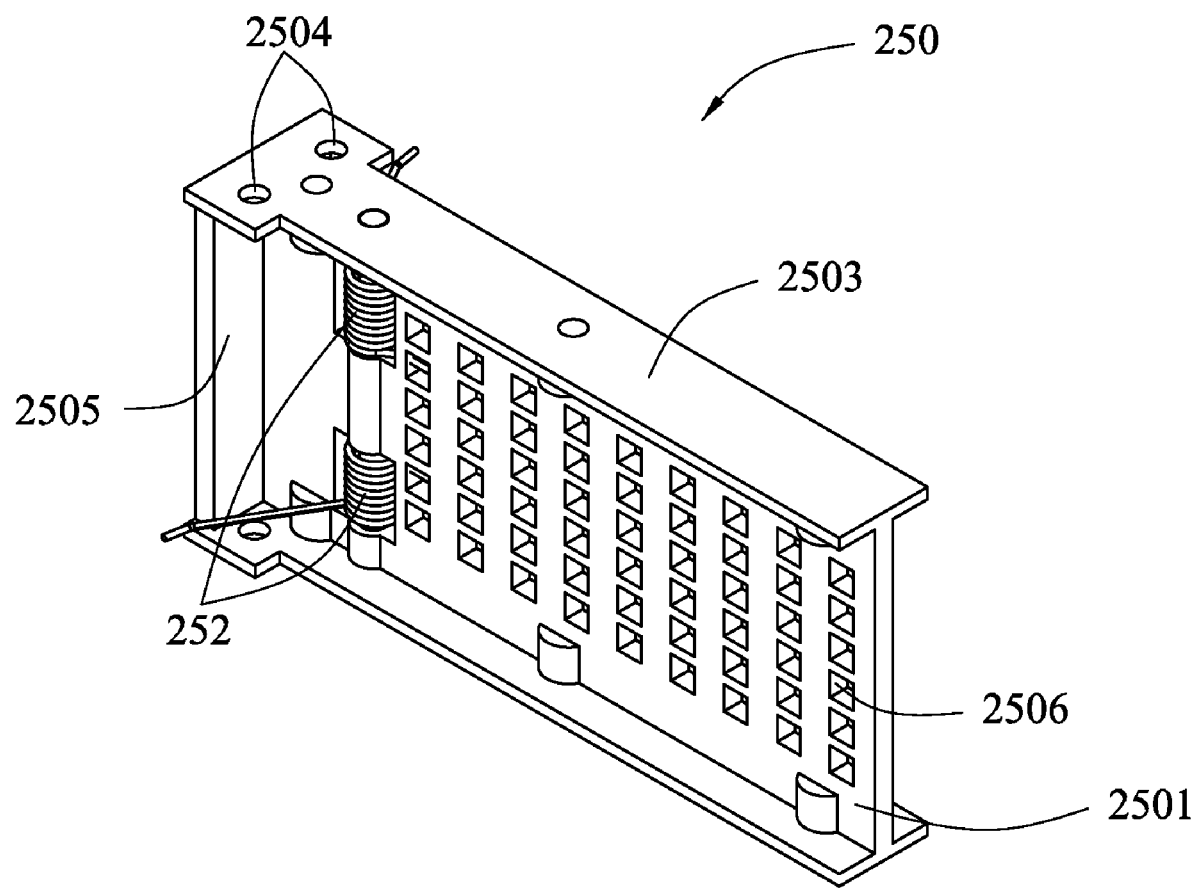
FIG. 4 is an assembled view of FIG. 3.

Referring also to FIGS. 3 and 4, the mounting plate 250 includes a vertical mounting wall 2501, two horizontal sidewalls 2503 horizontally extending from a top side and a bottom side of the mounting wall 2501 respectively, and an end wall 2505 vertically extending from a vertical end of the mounting wall 2501. A top and a bottom of the vertical wall 2505 are connected to the sidewalls 2503, respectively. Each of the sidewalls 2503 defines two pivoting holes 2504 in opposite sides thereof adjacent the end wall 2505. The mounting wall 2501 defines a plurality of vents 2506 therein. Two openings 2508 are defined in the mounting wall 2501 adjacent the end wall 2505. A through hole 2510 is defined in the mounting plate 250, extending through the sidewalls 2503 and the mounting wall 2501, and communicating with the openings 2508. Two resilient members, such as torsion springs 252, are respectively placed in the openings 2508, with through holes thereof aligning with the through hole 2510 of the mounting plate 250. A shaft 254 passes through the torsion springs 252 and is engaged in the through hole 2510 of the mounting plate 250, to mount the torsion springs 252 to the mounting plate 250.

Figure 5:
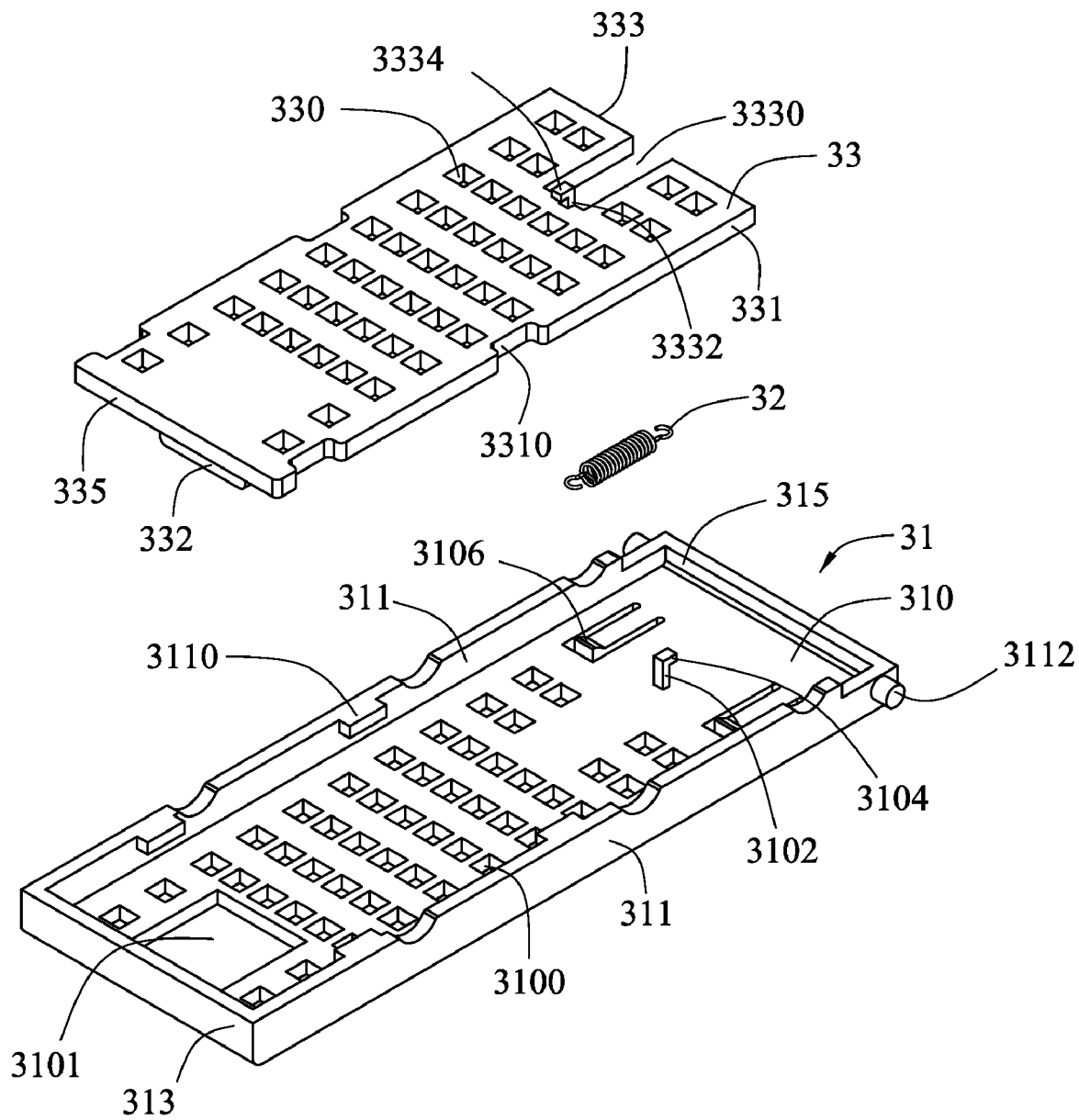
FIG. 5 is an exploded, isometric view of the first access flap of FIG. 2, viewed from another aspect.

Referring also to FIG. 5, each first access flap 30 includes a rotating plate 31, a sliding plate 33, and a resilient member such as an extension spring 32. The rotating plate 31 includes a main wall 310, two first sidewalls 311 perpendicularly extending from a top and a bottom of the main wall 310, a second sidewall 313 perpendicularly extending from an end of the main wall 310, and a third sidewall 315 perpendicularly extending from an opposite end of the main wall 310. The main wall 310 defines a plurality of first air holes 3100 therein. A through hole 3101 is defined in the main wall 310 adjacent the second sidewall 313. A post 3102 perpendicularly extends from the main wall 310 adjacent the third sidewall 315. A bent part 3104 perpendicularly extends from a top of the post 3102 toward the third sidewall 315. Two resilient hooks 3106 adjacent the third sidewall 315 extend from the main wall 310 toward the second sidewall 313, and are located at opposite sides of the post 3102. The distance between a distal end of each hook 3106 and the third sidewall 315 is greater than that between the post 3102 and the third sidewall 315. Each first sidewall 311 has two spaced protrusions 3110 vertically extending therefrom toward the other sidewall 311. A pivoting portion 3112 is formed from an end of each first sidewall 311 adjacent the third sidewall 315. The sliding plate 33 includes two first sidewalls 331 at opposite sides thereof, a second sidewall 333 at an end thereof, and a third sidewall 335 at an opposite end thereof. The sliding plate 33 defines a plurality of second air holes 330 therein, corresponding to the first air holes 3100 of the main wall 310 of the rotating plate 31. Each first sidewall 331 of the sliding plate 33 defines two spaced gaps 3310 therein, corresponding to the protrusions 3110 of a corresponding first sidewall 311 of the rotating plate 31. A great cutout 3330 is defined in the sliding plate 33 through the second sidewall 333. A post 3332 perpendicularly extends from the sliding plate 33 adjacent the cutout 3330. A bent part 3334 perpendicularly extends from a distal end of the post 3332 toward the third sidewall 335 of the sliding plate 33. An engaging portion 332 extends from the sliding plate 33 adjacent the third sidewall 335, away from the post 3332.

Figure 6:
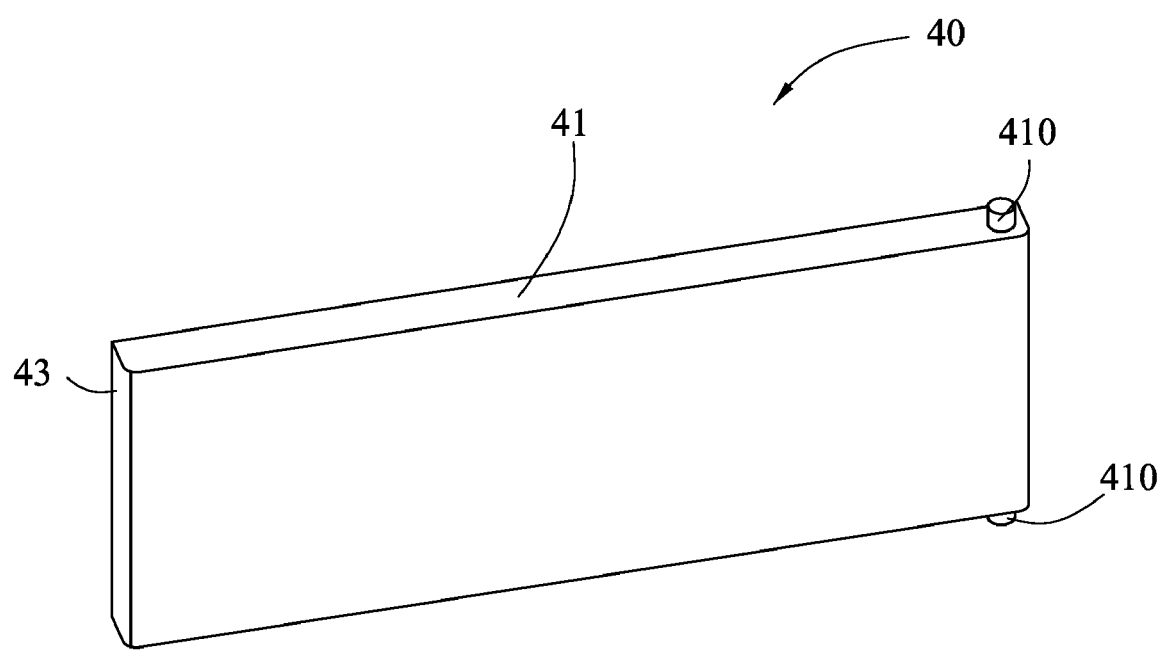
FIG. 6 is an isometric view of the second access flap of FIG. 2.

Referring also to FIG. 6, each second access flap 40 includes two first sidewalls 41 at opposite sides thereof and two second sidewalls 43 at opposite ends thereof. A pivoting portion 410 is formed from each first sidewall 41 adjacent a second sidewall 43.

Figure 7:
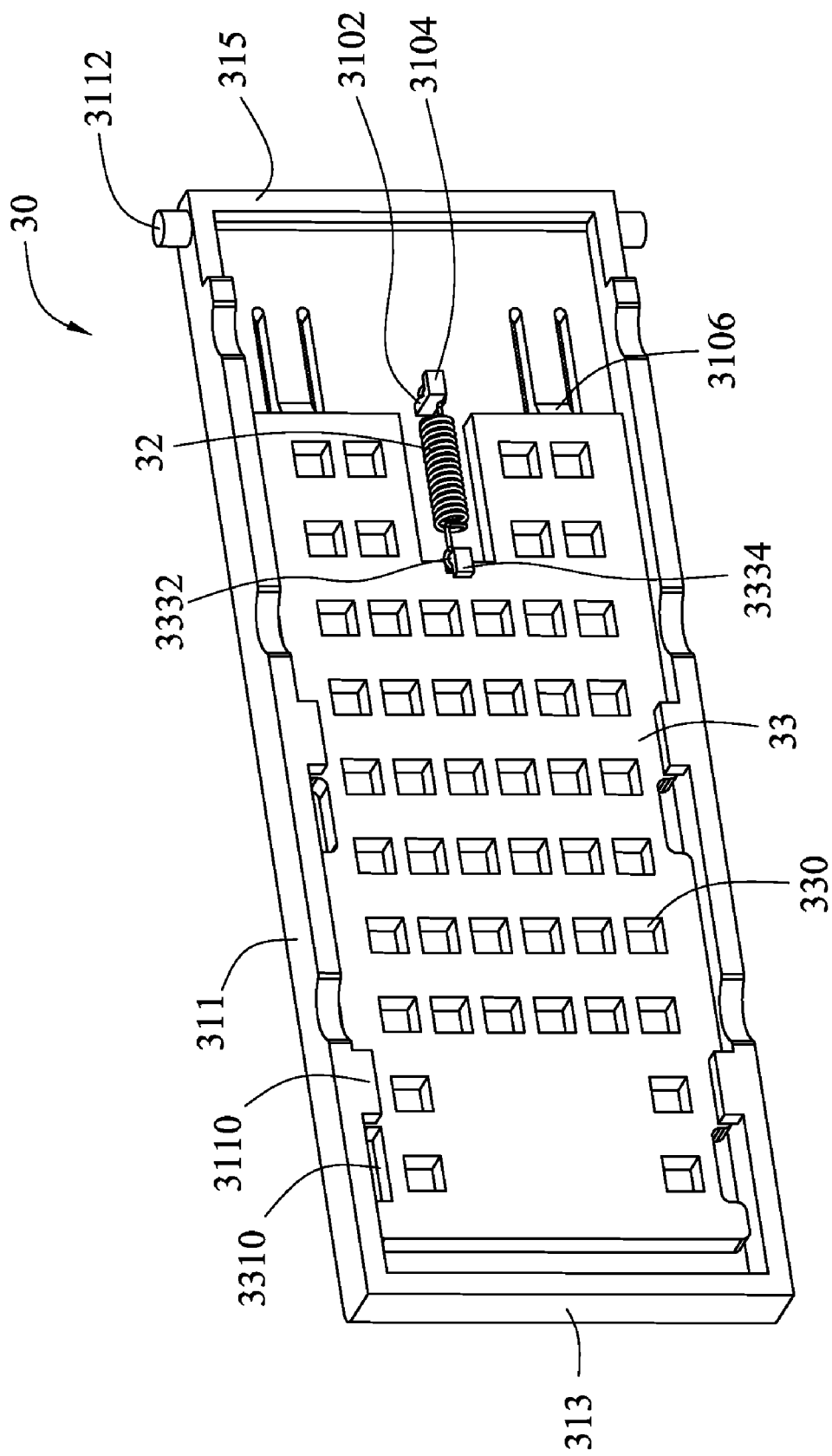
FIG. 7 is an assembled view of FIG. 5, viewed from another aspect.
Figure 8:
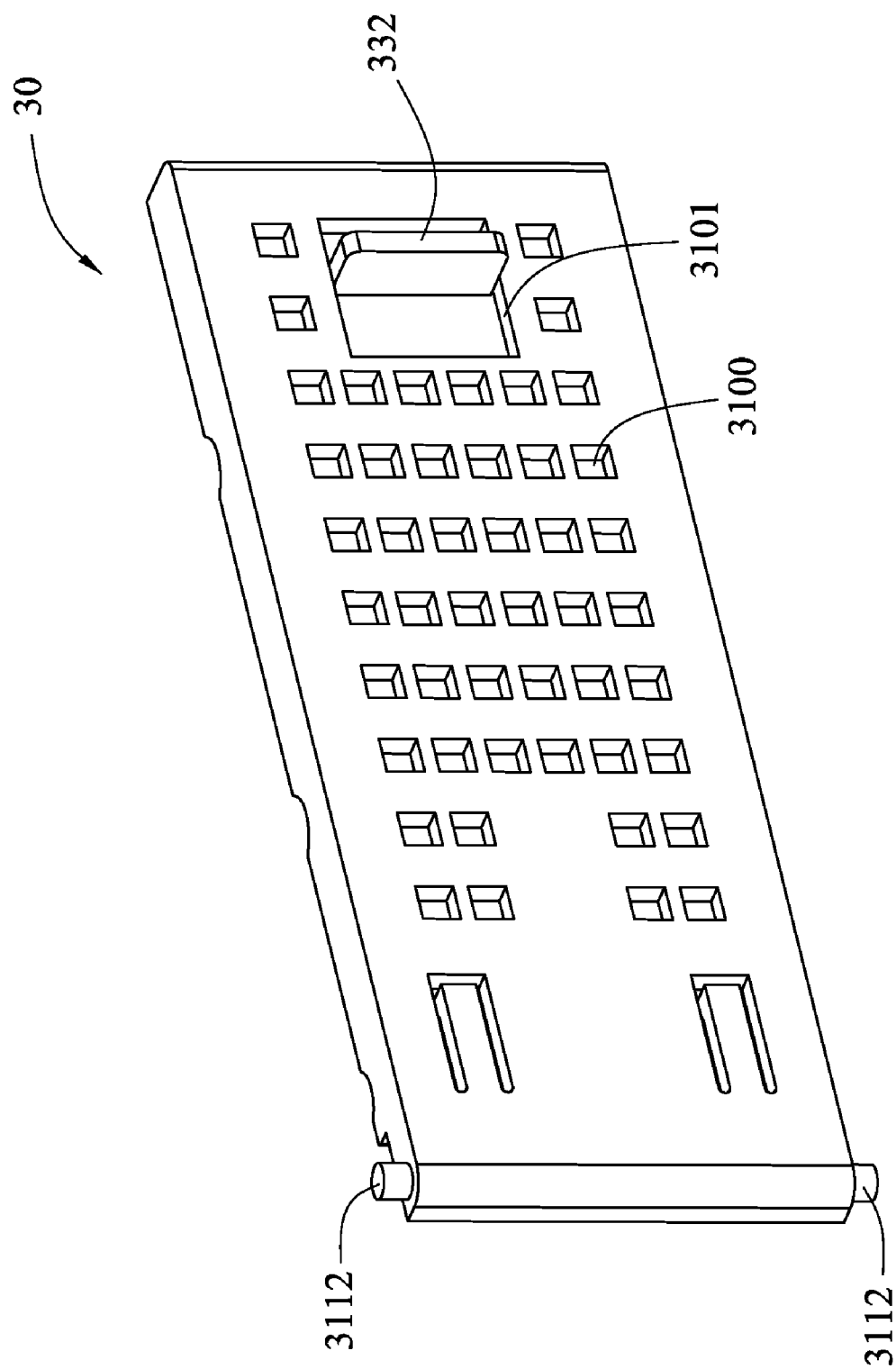
FIG. 8 is similar to FIG. 7, viewed from another aspect.
Figure 9:
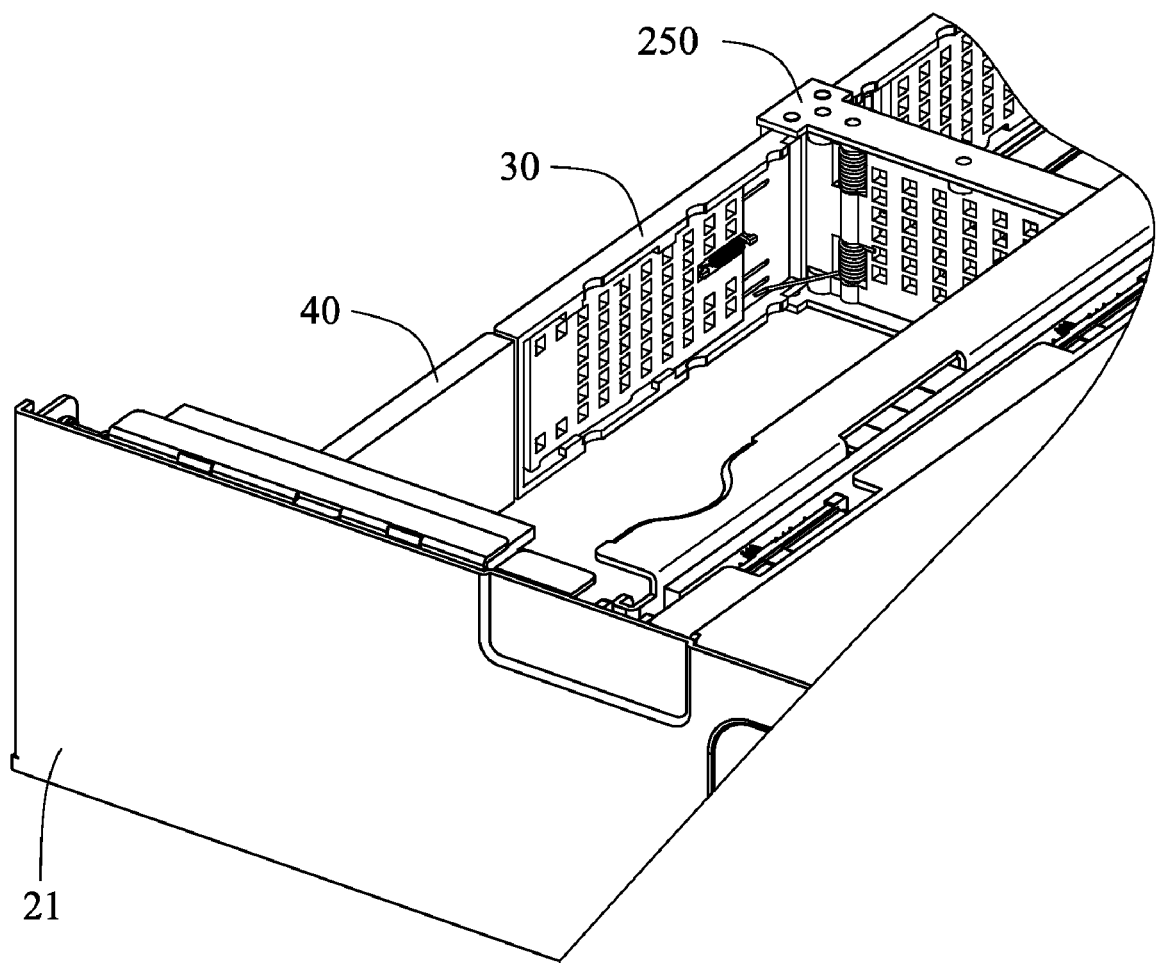
FIG. 9 is a partial, enlarged view of FIG. 2, viewed from another aspect and not showing the functional module.

Referring also to FIGS. 7, 8, and 9, in assembly, the sliding plate 33 is attached to the main wall 310 of the rotating plate 31 with the gaps 3310 thereof aligning with the corresponding protrusions 3110 of the rotating plate 31. The sliding plate 33 is moved to make the gaps 3310 thereof stagger with the protrusions 3110 of the rotating plate 31. The engaging portion 332 of the sliding plate 33 passes through the through hole 3101 of the rotating plate 31. Opposite ends of the extension spring 32 are engaged with the post 3102 of the rotating plate 31 and the post 3332 of the sliding plate 33 respectively. The bent parts 3104, 3334 can prevent opposite ends of the extension spring 32 from disengaging from the posts 3102, 3332.

The pivoting portions 3112 of each first access flap 30 is pivotably engaged in the corresponding pivoting holes 2504 of the mounting plate 250. Two arms of each torsion spring 252 are firmly engaged with the mounting wall 2501 of the mounting plate 250 and the main wall 310 of the rotating plate 31, respectively. The first access flap 30 is located at an inner side of the end wall 2505 of the mounting plate 250.

Figure 11:
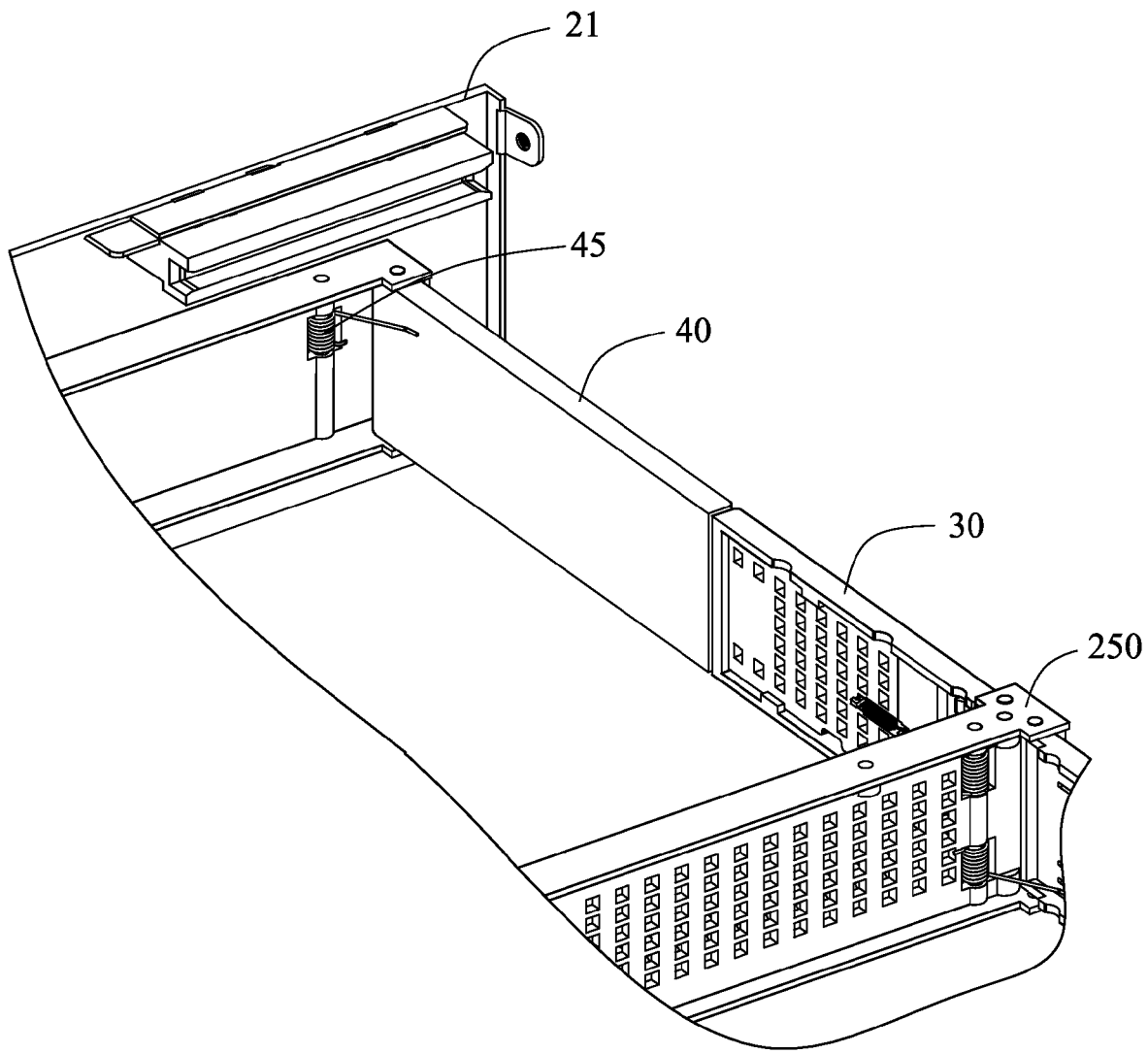
FIG. 11 is a partial, enlarged view of FIG. 2, but viewed from another aspect and not showing the functional module.

Referring also to FIG. 11, each second access flap 40 is pivotably mounted to an inner side of a corresponding side panel 21 via the pivoting portions 410 thereof. A torsion spring 45 is mounted between the side panel 21 and the second access flap 40. The second sidewall 43 away from the pivoting portions 410 of the second access flap 40 contacts the second sidewall 313 of the rotating plate 31 of the first access flap 30. The opening for the functional module 10 passing therethrough is capable of shielded by the first access flap 30 and the second access flap 40.

Figure 10:
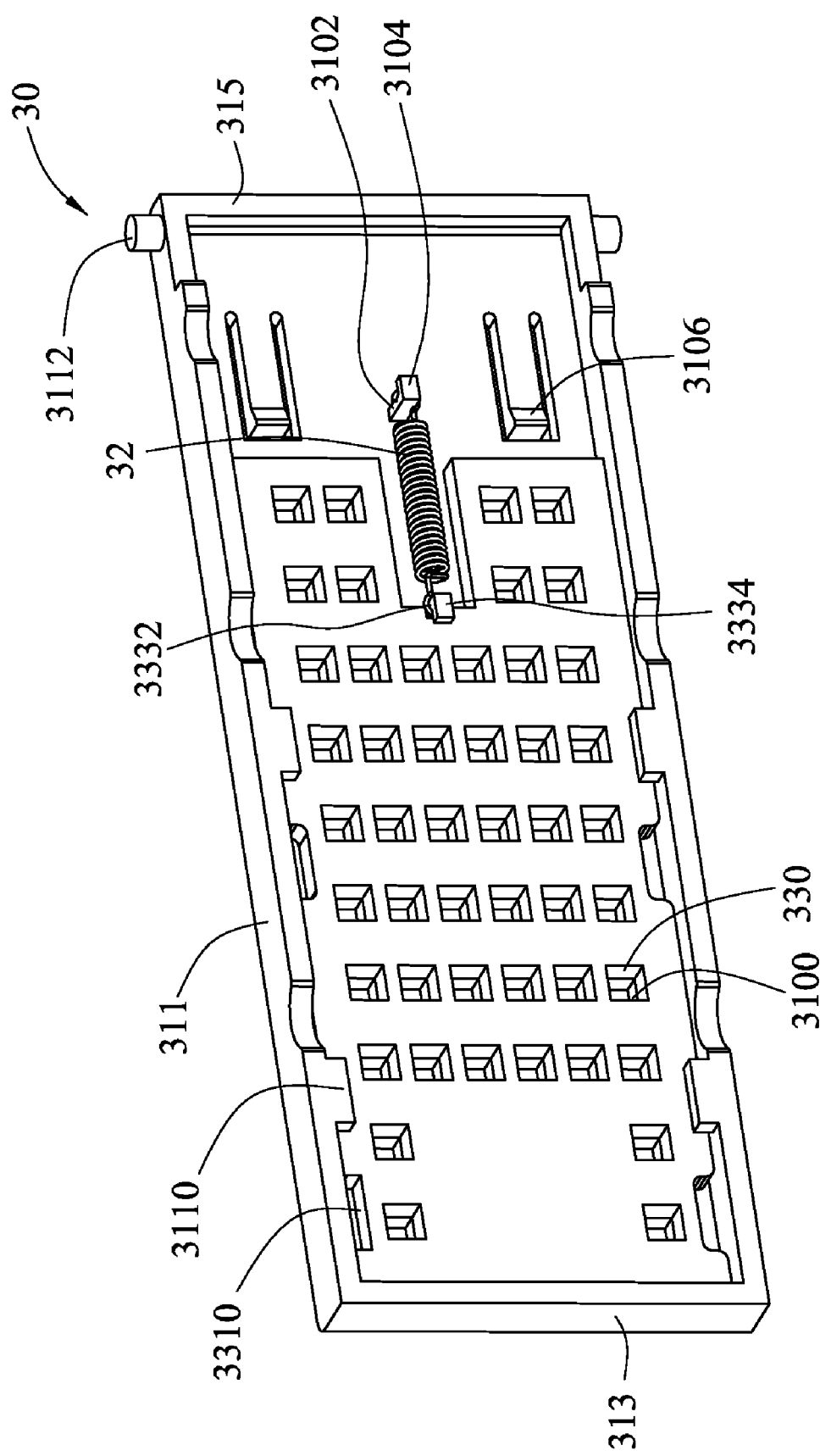
FIG. 10 is similar to FIG. 7, but showing the first access flap in a using state; and not showing the functional module.

Referring also to FIGS. 2 and 10, when the functional module 10 is passed through a corresponding opening shielded by a corresponding first access flap 30 and a corresponding second access flap 40, to enter into a corresponding space of the base 20. The rotating plate 31 of the first access flap 30 is urged by the functional module 10 to pivot about the pivoting portions 3112 thereof toward the mounting plate 250 against the torsion springs 252. The second access flap 40 is urged by the functional module 10 to pivot about the pivoting portions 410 thereof toward a corresponding side panel 21 of the base 20 against the torsion springs 45. Thus, the opening is exposed, and the torsion springs 252 are deformed. The engaging portion 332 of the sliding plate 33 is urged by the functional module 10 to drive the sliding plate 33 to slide along the main wall 310 toward the second sidewall 313 of the rotating plate 31 against the extension spring 32, until the third sidewall 335 of the sliding plate 33 contacts the second sidewall 313 of the rotating plate 31. Thus, the second air holes 330 of the sliding plate 33 are aligning with the first air holes 3100 of the rotating plate 31 and the vents 2506 of the mounting plate 250, to keep good heat dissipation for the server chassis.

When the functional module 10 is drawn out of base 20 through the opening of the base 20, the functional module 10 moves away from the first and second access flaps 30, 40. The torsion springs 252, 45 are restored. The first and second access flaps 30, 40 are pivoted back. The extension spring 32 is restored to drive the sliding plate 33 to slide toward the hooks 3106, until the second sidewall 333 of the sliding plate 33 abuts against the hooks 3106 of the rotating plate 31. The second air holes 330 of the sliding plate 33 are staggered with the first air holes 3100 of the rotating plate 31. Thus, the opening of the base 20 is shielded by the first and second access flaps 30, 40.

In other embodiments, if a length of the first access flap 30 is long enough to shield the opening of the base 20, the second flap 40 can being omitted.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A server chassis comprising an opening and an access flap, the access flap comprising:
    a rotating plate pivotally mounted to a side of the opening, the rotating plate defining a plurality of first air holes therein;
    a sliding plate comprising an engaging portion, defining a plurality of second air holes, sliding plate being slidably attached to the rotating plate, and capable of moving between a first and a second position;
    a first resilient member with one end being connected to the rotating plate, the other end being connected to the server chassis, biasing the rotating plate to obstruct the opening; and
    a second resilient member with one end being connected to the rotating plate, the other end being connected to the sliding plate, biasing the sliding plate to the first position;
    wherein the rotating plate is capable of rotating to expose the opening; the engaging portion is configured to engage a module inserted into the opening and cause the sliding plate to slide along the rotating plate to the second position; in the first position, the second air holes do not align with the first air holes; and in the second position, the second air holes align with the first air holes.

2. The server chassis as claimed in claim 1, wherein the second resilient member is an extension spring.

3. The server chassis as claimed in claim 1, wherein the rotating plate comprises a main wall, a post that perpendicularly extends from the main wall, the first end of the second resilient member is engaged with the post.

4. The server chassis as claimed in claim 3, wherein the main wall comprises two resilient hooks, the hooks abut the sliding plate in the first position.

5. The server chassis as claimed in claim 3, wherein a through hole is defined in the main wall and the engaging portion is located through the through hole.

6. The server chassis as claimed in claim 3, wherein the rotating plate further comprises two spaced protrusions; the sliding plate is slidably located between the protrusions and the main wall.

7. The server chassis as claimed in claim 1, wherein the first resilient member is a torsion spring.

8. A server chassis for mounting a functional module, comprising:
    a base defining a space capable of receiving the functional module; the base further defining an opening in an end thereof, the opening communicating with the space for the functional module passing therethrough to enter into the space;
    a rotating plate with one end being pivotably mounted to a side of the opening, and the other end being close to the other side of the opening; the rotating plate defining a plurality of first air holes therein;
    a sliding plate comprising an engaging portion, defining a plurality of second air holes, the sliding plate being slidably attached to the rotating plate, and capable of moving between a first and a second position;
    a first resilient member with one end being connected to the rotating plate, the other end being connected to the server chassis, biasing the rotating plate to obstruct the opening; and a second resilient member with one end being connected to the rotating plate, the other end being connected to the sliding plate, biasing the sliding plate to the first position;

wherein the rotating plate is capable of rotating to expose the opening; the engaging portion is adapted to engage a module inserted into the opening and cause the sliding plate to slide along the rotating plate to the second position; in the first position, the second air holes do not align with the first air holes; and in the second position, the second air holes align with the first air holes.

9. The server chassis as claimed in claim 8, wherein the second resilient member is an extension spring.

10. The server chassis as claimed in claim 8, wherein two resilient hooks extend from the rotating plate, the hooks abut the sliding plate in the first position.

11. The server chassis as claimed in claim 10, wherein a through hole is defined in the rotating plate away from the hooks, the engaging portion of the sliding plate passes through the through hole of the rotating plate to be capable of contact the functional module.

12. The server chassis as claimed in claim 8, wherein the first resilient member is a torsion spring.

* * * * *